United States Patent [19]
Paoli

[11] Patent Number: 5,321,714
[45] Date of Patent: Jun. 14, 1994

[54] REFLECTION SUPPRESSION IN SEMICONDUCTOR DIODE OPTICAL SWITCHING ARRAYS

[75] Inventor: Thomas L. Paoli, Los Altos, Calif.

[73] Assignee: Xerox Corporation, Stamford, Conn.

[21] Appl. No.: 989,859

[22] Filed: Dec. 14, 1992

[51] Int. Cl.[5] ............................. H01S 3/19; G02B 6/12
[52] U.S. Cl. ........................................ 372/50; 372/7; 372/43; 372/49; 372/107; 372/108; 385/131; 385/132; 359/333; 359/344
[58] Field of Search .................. 372/7, 43, 44, 45, 47, 372/48, 49, 50, 107, 108, 109; 359/333, 342, 345, 344; 385/129, 16, 130, 18, 131, 49, 132, 14

[56] References Cited
U.S. PATENT DOCUMENTS

| | | |
|---|---|---|
| 4,689,797 | 8/1987 | Olshansky ........................ 372/50 X |
| 4,802,182 | 1/1989 | Thornton et al. ................. 372/50 |
| 4,811,351 | 3/1989 | Matsui et al. ..................... 372/50 |
| 4,871,226 | 10/1989 | Courtney et al. ............... 385/49 X |
| 4,892,374 | 1/1990 | Ackerman et al. ............. 385/49 X |
| 4,965,525 | 10/1990 | Zah ................................ 372/49 X |
| 5,023,882 | 6/1991 | Paoli ................................ 372/50 |
| 5,088,105 | 2/1992 | Scifres et al. ................... 372/49 X |
| 5,089,908 | 2/1992 | Jodoin et al. ................... 359/212 |
| 5,200,969 | 4/1993 | Paoli ................................ 372/50 |
| 5,214,664 | 5/1993 | Paoli ............................. 372/50 X |
| 5,252,513 | 10/1993 | Paoli et al. ..................... 372/50 X |
| 5,267,255 | 11/1993 | Paoli ................................ 372/50 |

Primary Examiner—Brian Healy
Attorney, Agent, or Firm—William Propp

[57] ABSTRACT

Passive waveguides within a monolithic semiconductor structure are coupled to angled facets to reduce the reflectivity of the angled facets and thereby increase the gain available from for the amplification waveguides coupled to the passive waveguides.

7 Claims, 4 Drawing Sheets

REFLECTION SUPPRESSION IN SEMICONDUCTOR DIODE OPTICAL SWITCHING ARRAYS

BACKGROUND OF THE INVENTION

This invention relates to a semiconductor diode optical amplifier, optical switch and optical modulator arrays within monolithic semiconductor structures and, more particularly, to combining angled facets with passive waveguides to decrease reflectivity of input and output facets and/or decrease the angle of those facets in angled arrays of optical amplifiers, optical switches, or optical modulators.

Semiconductor optical amplifiers are of interest for increasing the level of weak optical signals in fiber optic communications systems, for multiple electrode optical switches used to route signals in optical communication systems, for line-printing elements in advanced xerographic printers, and potentially as modulators for high-speed coding of information.

One of the most stringent requirements for operation of a semiconductor optical amplifier is suppression of internal optical reflections from the input and output facets of the semiconductor structure.

Semiconductor optical amplifiers require facets with exceptionally low internal reflectivity in order to suppress the onset of laser operation and thereby provide optical gain levels greater than those required to achieve lasing. Previously, reported work with optical amplifiers has achieved about 0.01% reflectivity by combining anti-reflective coatings on the facets, angling the amplification waveguide with respect to the facets, and flaring the amplification waveguide near the facet. However, this degree of suppression required the amplification waveguide to be inclined at 7 degrees to the facet normal. Inclination of the waveguide at such large angles with respect to the normal makes input and output coupling cumbersome and inefficient and leads to crescent shaped output profiles, known in the art as coma.

The flared ends of an amplification waveguide coupled to a facet are susceptible to conversion of single mode lasing to multiple mode outputs. Also, flared ends to amplification waveguides are difficult to fabricate within a closely spaced monolithic semiconductor structure array of amplifiers and other optical devices.

It is an object of this invention to provide an improved means for suppressing internal optical reflection at the input and output facets of a semiconductor optical amplifier.

It is another object of this invention to provide a means of reducing the angle to the input and output facets of a semiconductor optical amplifier array while still suppressing optical reflection at the facet.

It is another object of this invention to provide non-flared waveguides coupled to the input and output facet of a semiconductor optically amplifying array while still suppressing optical reflection at the facet.

It is yet another object of this invention to provide a means for suppressing internal optical reflection at the input and output facets of a semiconductor structure optical switching array.

SUMMARY OF THE INVENTION

In accordance with the present invention, passive waveguides within a monolithic semiconductor structure are coupled to angled facets to reduce the reflectivity of the angled facets and thereby increase the gain available from the amplification waveguides coupled to the passive waveguides Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
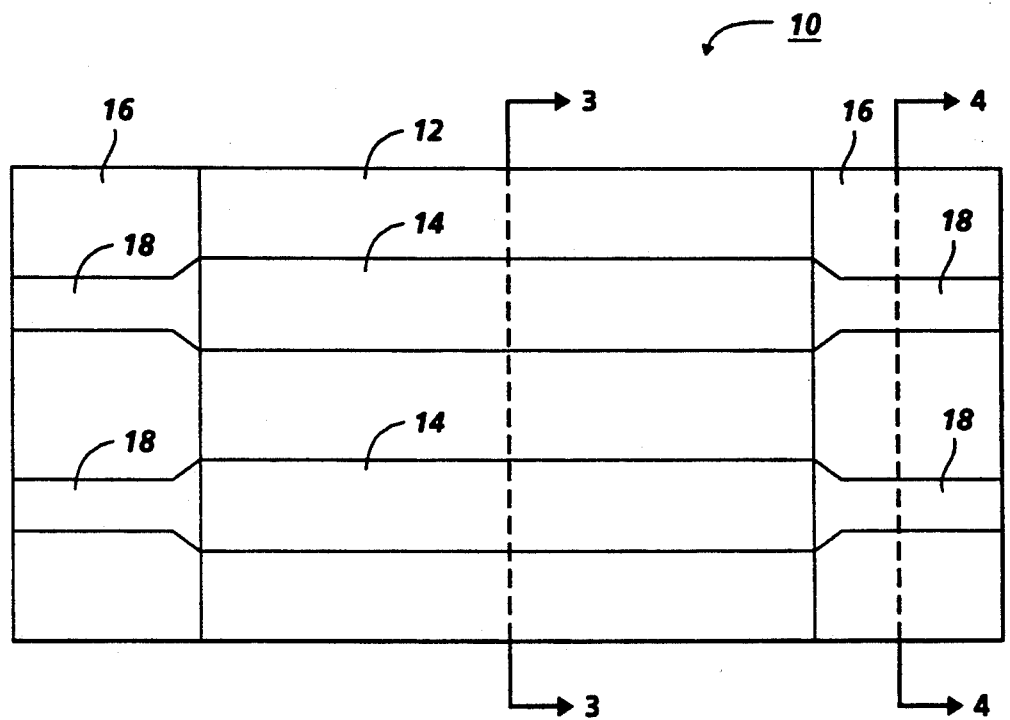
FIG. 1 is a schematic illustration of the top view of a semiconductor heterostructure with buried planar active optical waveguides and buried planar passive lowloss optical waveguides formed according to the present invention.
Figure 2:
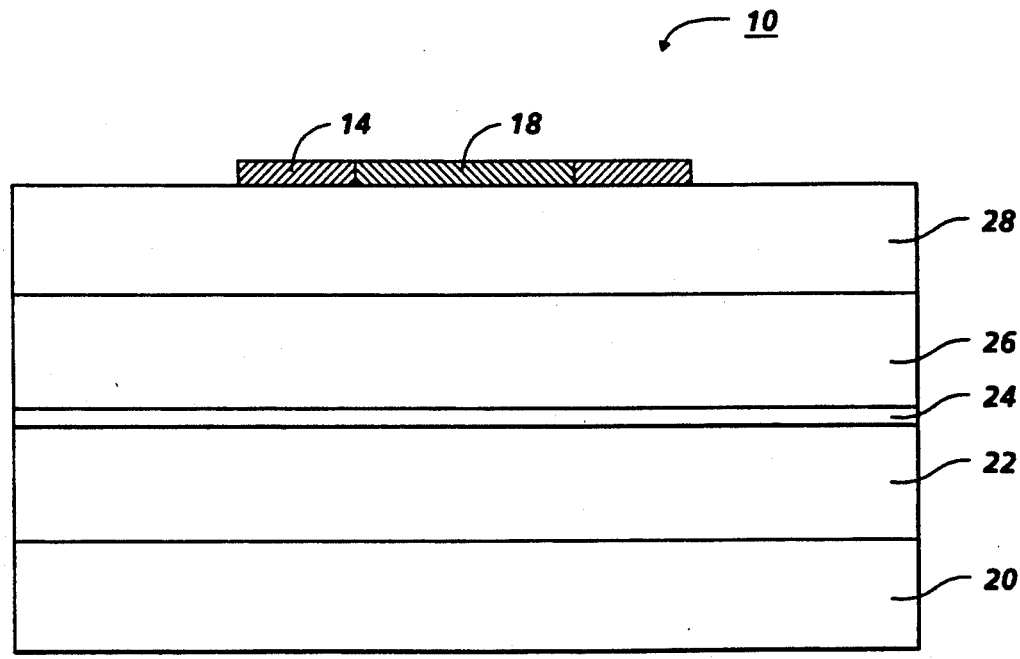
FIG. 2 is a schematic illustration of the end view of the semiconductor heterostructure with buried planar active optical waveguides and buried planar passive lowloss optical waveguides of FIG. 1 before selective impurity induced disordering formed according to the present invention.

Reference is now made to FIGS. 1 and 2, wherein there is illustrated a monolithic semiconductor structure 10 with buried planar active optical waveguides and buried planar passive lowloss optical waveguides.

As shown in FIG. 1, the semiconductor heterostructure 10 has a central section 12 with a mask 14 for forming the buried planar active optical waveguides and end sections 16 with a mask 18 for forming the buried planar passive lowloss optical waveguides.

As a particular example, mask portion 14 may be typically about 4 μm wide and mask 18 may be typically 2 μm wide. The wider dimensions of mask portion 14 determines the width of the pumping stripe for the active optical waveguide of section 12 and the narrower dimension of mask portion 18 is sufficiently narrow to achieve some degree of impurity induced disordering substantially into if not through its active region portion beneath the mask for the passive waveguide. The central core of the active region 24 underneath mask portion 18 is less completely interdiffused by the impurity induced disordering process as compared to the adjacent disordered regions of the active region 24 not fully protected by mask portion 18.

As shown in FIG. 2, the semiconductor heterostructure 10 comprises a substrate 20 of n-GaAs upon which is epitaxially deposited a first cladding layer 22 of n-$Al_yGa_{1-y}As$ wherein $y \geq 0.40$; an active layer 24 of multiple quantum wells of four 12 nm quantum wells 32 of $Ga_{1-x}Al_xAs$, wherein $x=0.05$, separated by three 6 nm barriers 34 of $Ga_{1-z}Al_zAs$, wherein $z=0.20$, a second cladding layer 26 of p-$Al_yGa_{1-y}As$ wherein $y \geq 0.40$, and a cap layer 28 of p+GaAs. This monolithic semiconductor structure is a semiconductor heterostructure since the layers within the structure are different semiconductor materials.

The active layer 24 may, in the alternative, be non-doped or p-type doped or n-type doped; GaAs, $Al_zGa_{1-z}As$ where $y>z$ or $(Al_zGa_{1-z})_{0.5}In_{0.5}P$; or a relatively thin conventional double heterostructure (DH) active layer; or a single quantum well, such as GaAs or $Al_zGa_{1-z}As$ where $z<y$; or a multiple quantum well superlattice, such as alternating layers of GaAs and $Al_zGa_{1-z}As$ where $z<y$ or alternating layers of $Al_wGa_{1-w}As$ and $Al_BGa_{1-B}As$ where $w<B<y$ (w for well and B for barrier). Also, in the alternative, any of the aforementioned active layers can be deposited between two semiconductor confinement layers of $Al_mGa_{1-m}As$ and $Al_nGa_{1-n}As$, where $m=$or $\neq n$, but with the bandgaps intermediate between the bandgaps of the active layer and the first and second cladding layers, in a separate confinement structure.

As is known in the art, the epitaxial growth of the semiconductor heterostructure 10 may be carried out by molecular beam epitaxy (MBE) or metalorganic chemical vapor deposition (MOCVD). The substrate 20 may be about 100 microns thick. The cladding layers 22 and 26 may have a thickness in the range of 0.1 to 1 micron. The active layer 24 may be a thin conventional layer having a thickness of 50 nanometers to 2 microns or may be comprised of a superlattice structure of quantum wells which may be 3 to 50 nanometers thick. This active region 24 of multiple quantum wells has a thickness of approximately 66 nm. The cap layer 28 is typically 0.1 to 0.2 microns thick.

There are alternate conventional techniques and diffusion/implant species for carrying out the desired disordering or the elemental implant/annealing technique to form the amplification waveguides and the passive waveguides. Discussion hereafter will be confined to impurity induced disordering. However, it should be noted that these other techniques and elemental diffusions or implants are equally applicable to form the amplification waveguides and the passive waveguides.

Upon completion of the epitaxial growth, masks 14 and 18 of $Si_3N_4$ are formed on the top surface of the cap layer 28 of the semiconductor heterostructure 10 with openings exposing regions of the semiconductor structure to impurity induced disordering. The masks protect the unexposed regions which will form and shape the active and passive optical waveguides.

The active and passive optical waveguides are established by first selectively diffusing a high concentration n-impurity dopant, such as silicon, into the regions of the semiconductor structure exposed through the mask. Other n-impurity dopant elements would include Ge and Sn.

A silicon layer is deposited in the opening in the $Si_3N_4$ mask and then capped with an additional layer of $Si_3N_4$. The diffusion of silicon is accomplished at a temperature of approximately 800° C. and is maintained for a sufficiently long period of time, e.g. seven to eight hours, to penetrate the cap layer 28, the second cladding layer 26 and the active layer 24, and partially penetrate the first cladding layer 22.

Figure 3:
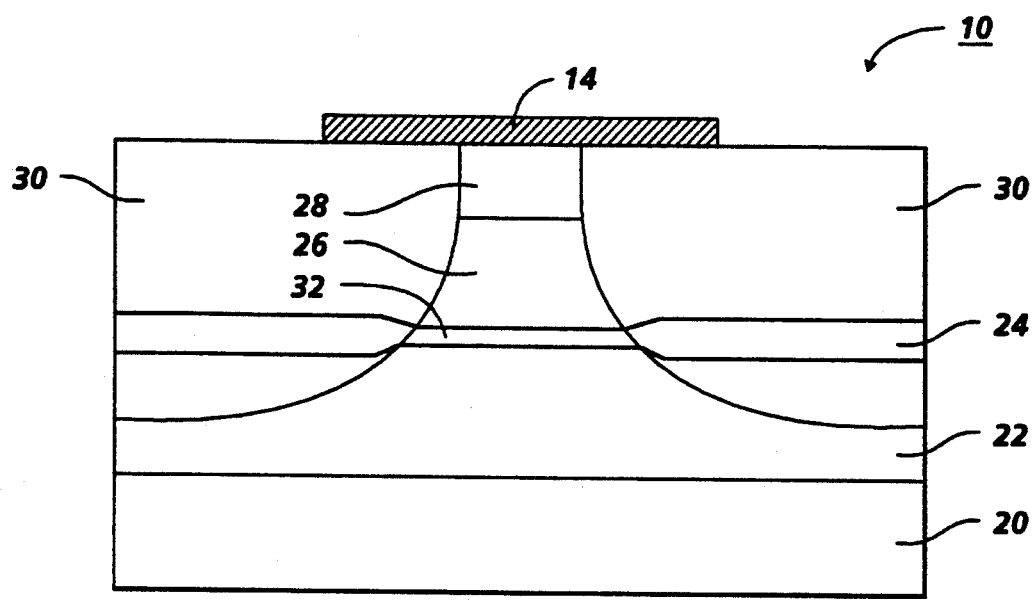
FIG. 3 is a schematic illustration of the cross-sectional end view of the semiconductor heterostructure with one buried planar active optical waveguide along the line 3—3 in FIG. 1 after selective impurity induced disordering formed according to the present invention.
Figure 4:
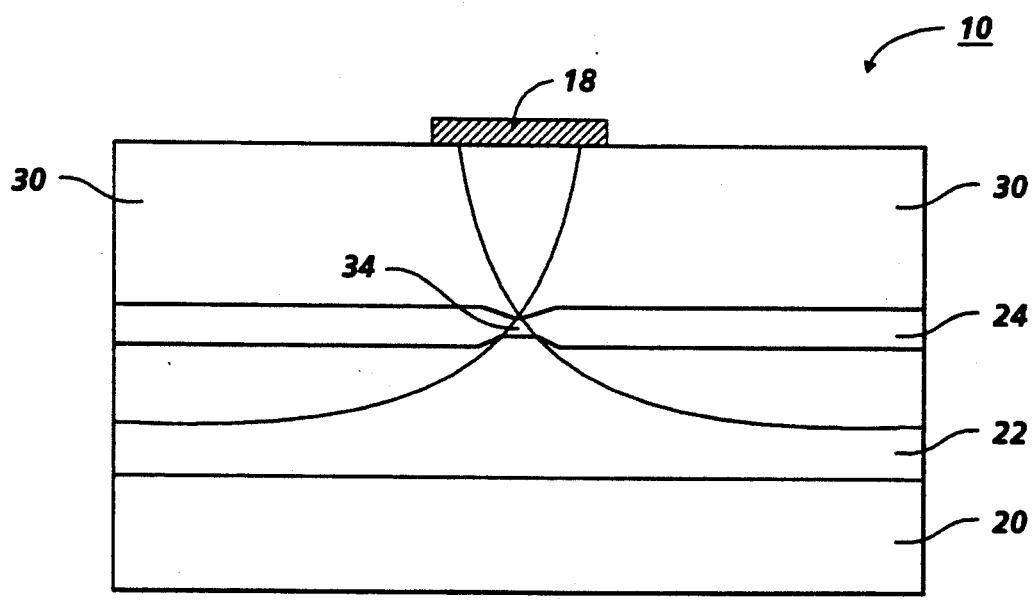
FIG. 4 is a schematic illustration of the cross-sectional end view of the semiconductor heterostructure with one buried planar passive lowloss optical waveguide along the line 4—4 in FIG. 1 after selective impurity induced disordering formed according to the present invention.

The diffusion of silicon through and into the active layer 24, the cap layer 28 and the cladding layers 22 and 26 causes an intermixing of Ga and Al in the active layer 24, the cap layer 28 and the cladding layers 22 and 26, thereby forming a n-impurity induced disordered region 30, as shown in FIGS. 3 and 4.

FIG. 3 is the cross-sectional view of the semiconductor heterostructure along line 3—3 in FIG. 1. The larger mask 14 forms two separate disordered regions 30. Between the disordered regions 30 in the semiconductor heterostructure 10 are the remaining non-disordered regions of the cap layer 28, the second cladding layers 26, the active layer 24 and the first cladding layers 22. The non-disordered region of the active layer 24 between the disordered regions 30 in the semiconductor heterostructure 10 forms the active optical waveguide 32. The active optical waveguide is operated below the lasing threshold, i.e. lasing is suppressed by suppressing optical feedback between the mirrors at the facets. Without lasing, the amplification waveguide functions as an optical amplifier for input light when the amplification waveguide is forward biased. The disordered regions, optically and electrically, isolate and separate the active optical waveguide of the semiconductor heterostructure. The active optical waveguides are shaped by the cladding layers in the vertical direction and the shape of the disordered regions in the horizontal direction.

The mask 14 is removed from the semiconductor heterostructure 10 and contacts (not shown) can be formed on opposite sides of the heterostructure 10 on the cap layer 28 and the substrate 20. Standard masking means or other techniques can be employed to form metal contacts of Cr-Au or Ti-Pt-Au or Au/Ge.

Current is injected between the cap layer contact and the substrate contact to forward-bias the p-n junction of p-cladding layer 26 and n-cladding layer 22 to cause the active optical waveguide 32 to amplify input optical radiation through stimulated emission.

Alternately, instead of an active optical waveguide, biasing the active region 32 with zero or a reverse voltage causes light to be absorbed, thereby producing photocurrent in an external circuit. For this state, the active layer functions as a photodetector that can be used to monitor information signals contained in the intensity modulation of any light beam in the active region 32. Such signals can be used to adjust the gain in the on state to correct for nonuniform illumination or to detect the presence of specific beams whose intensities have been appropriately modulated. For example, a packet of information in the form of light pulses can include an address in its header which instructs a controller to turn on the optical waveguide if transmission through that channel is desired. When an active layer is forward biased, variations in the input intensity will also produce variations in the output voltage at constant current that are small but perhaps similarly useful.

For the active optical waveguides, the current is injected substantially perpendicular to the active optical waveguide 32, through the cap layer contact, the p-cap layer 28, the p-cladding layer 26, the active optical waveguide 32, and then spreads in the n-cladding layer 22, into the substrate 20, and out the substrate contact. Regions 30 can be proton bombarded if needed to confine the current to the active optical waveguides and to isolate the contact from underlying disordered regions.

The ground or substrate contact can be common to more than one or even all the active optical waveguides. However, each active optical waveguide contains a p-n junction that is separately biased through its cap layer contact from all the others. Since each active optical waveguide is positively biased with respect to ground, current flows only from each cap layer contact to ground. The disordered regions prevent current from any single contact from leaking to an adjacent amplification waveguide and thereby affecting its optical gain. Current between different cap layer contacts does not occur because any small potential difference between the addressed cap layer contact and a neighboring cap layer contact corresponds to a reverse voltage on one of the lateral p-n junctions formed by the disordering.

FIG. 4 is the cross-sectional view of the semiconductor heterostructure along line 4—4 in FIG. 1. The narrower mask 18 forms two overlapping disordered regions 30. The cap layer 28 and the second cladding layer 26 will be completely disordered with the disordered region 30 in the semiconductor heterostructure 10 encompassing the regions of the cap layer 28 and the second cladding layer 26. Between the disordered regions 30 in the semiconductor heterostructure 10 are the active layer 24 and the first cladding layer 22. The active layer will be initially or partially disordered. The partially disordered region of the active layer 24 between the disordered regions 30 in the semiconductor heterostructure 10 forms the passive optical waveguide 34. The disordered regions, optically and electrically, isolate and separate the passive optical waveguide of the semiconductor heterostructure. The passive optical waveguides are shaped by the disordered regions in the horizontal direction and the first cladding layer and the partially disordered second cladding layer in the vertical direction.

The mask 18 is removed from the semiconductor heterostructure 10 and no contact is formed on the cap layer 28. The optical waveguide 18 is not biased and thus functions as a passive element. Alternately, the cap layer 28 can be metalized provided that the cap layer 28 above the passive waveguides is proton bombarded to render this region insulating and therefore not electrically pumped. The initial or partially disordering of the active layer 24 will make the passive optical waveguide 34 transparent to radiation at any wavelength amplified by the amplification waveguide, i.e. the wavelength of the input light beam. Light propagated through the amplification waveguide will be smoothly transmitted through the passive waveguide.

The waveguiding strength of the passive waveguide 34 section of the active layer 24 of section 16 may be varied by changing the time of the impurity induced disordering and thereby fine tuning its refractive index properties for preferred modal operation in the partially disordered active layer 24 of the passive waveguide 34.

The diffraction and scattering losses within the two-dimensional passive optical waveguide are low. The propagation loss along the two-dimensional passive optical waveguide is also low, due to its increased energy bandgap.

The passive waveguides 34 are unique in that they can be fabricated in a monolithic and planar fashion and provide subsurface passive optical waveguide structures that are easily made coplanar, coaxial, and coupled with the buried amplification waveguides. When forward-biased, the optical gain media of the amplification waveguides can amplify signals to reduce the overall propagation loss of the total structure to compensate for splitting loss. Semiconductor structures incorporating these two dimensional passive waveguides permit the monolithic integration of optical and electronic components on a single semiconductor structure.

A fuller description of one method for forming the index-guided amplification waveguides 32 and low-loss index-guided passive waveguides 34 is fully disclosed in U.S. Pat. No. 4,802,182 to Thornton et al. which is commonly assigned to the same assignee as the present application and is hereby incorporated by reference. There are alternate conventional techniques and diffusion/implant species for carrying out the desired disordering or the elemental implant/annealing technique to form the waveguides. These other techniques and elemental diffusions or implants are equally applicable. Alternately, these semiconductor structures can be formed by etch and regrowth techniques known in the art.

The active layer in the index-guided amplification waveguides 32 and the passive waveguides 34 has a higher index of refraction than the neighboring areas of disordered active layer 24 and a higher index of refraction than cladding layers 22 and 26. Thus, the light amplified in the amplification waveguides 32 and transmitted by the low-loss passive waveguides 34 is confined by the well-known phenomena of total internal reflection within the active layer 24 of the waveguides.

The passive waveguides 34 are integrally formed in the active medium and have an energy bandgap greater than the energy of the amplified lightwaves so that the coupling of the passive waveguide is nearly transparent to light from the amplification waveguides and does not need to be forward-biased to transmit the lightwaves. These transparent passive waveguides 34 can be narrower than the amplification waveguides 32. If the transparent passive waveguides 34 are sufficiently narrow they provide improved input/output coupling.

Figure 5:
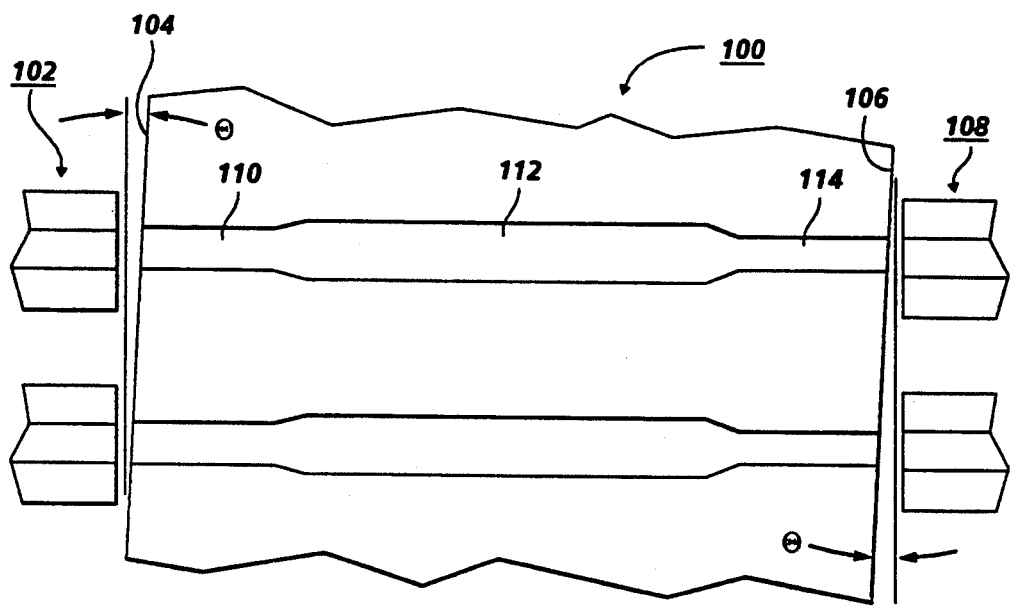
FIG. 5 is a schematic illustration of a monolithic semiconductor structure in which the optical fiber provides incident light waves to the angled facets and the passive optical waveguides coupled to an array of amplifying waveguides formed according to the present invention.

Coupling of the input or output beam to the amplification waveguides or other active elements in the semiconductor structure can be enhanced by using narrow transparent waveguides as shown in FIG. 5. Because the mode in the narrow waveguide is only weakly confined, it presents a larger cross-section to the incoming beam than the wider, amplification waveguide. Similarly the narrow guide radiates with less divergence and thereby couples more effectively into an output fiber than the wide guide with strong optical confinement.

The semiconductor heterostructure 100 of FIG. 5 suppresses the optical reflections from the input facet 104 of the structure 100 and from the output facet 106 of the structure 100. The input facet and output facet are on opposing sides of the semiconductor heterostructure and perpendicular to the semiconductor layers, including the active layer in the heterostructure. The input facet 104 and the output facet 106 are both coated with an anti-reflective coating to help minimize reflectivity. A passive waveguide 110 at the input facet 104 of the heterostructure 100 transmits light from the input optical fiber 102 and the angled input facet 104 through to an active optical waveguide 112. The passive waveguide increases the effectiveness of the angle θ of the facet 104, measured from the normal. The addition of the narrow waveguide reduces substantially the angling of the facet required to reduce the reflectivity to an acceptable level.

The effectiveness of the angling is increased by introducing at each facet a passive waveguide whose width is chosen to be less than the critical width required for confinement of the optical mode. Thus, optical reflections are suppressed at the facets of the semiconductor heterostructure which suppresses lasing in the active cavity and thereby allows operation of the heterostructure diode structure as an optical switch with increased gain in its on state.

Reflections from the angled input and output facets couple back into the waveguide only to the extent that the Fourier transform of the reflected mode overlaps with the transform of the incident mode. For a Gaussian field distribution, the effective mode reflectivity, R, is $$R = 0.3 \times \exp[-(nW\theta/\lambda)^2]$$  Equation 1 where n is the refractive index of the passive waveguide, W is the mode width, θ is the passive waveguide's inclination from the facet normal, and λ is the wavelength.

Consequently, increasing the modal width W at the facet decreases the reflection into the passive waveguide. The modal width can be increased at the facet by utilizing a waveguide whose width is less than required for maximum confinement of the light beam in the waveguide.

By way of example, an AlGaAs waveguide inclined at 3 degrees to the normal has an expected reflectivity of about 3% for a 2 μm mode and about $5 \times 10^{-4}$% for a 4 μm mode. This strong reduction of the reflectivity by incorporation of the narrow waveguide enables adequate suppression of the reflection to be obtained at significantly shallower angles.

Effective suppression of the reflection requires a reflectivity R less than 0.01%. An AlGaAs waveguide with a 2 μm mode must be inclined at an angle greater than 5.7 degrees in order to achieve R<0.01% while 4 μm, 6 μm, and 8 μm modes require angles greater than 2.9 degrees, 1.9 degrees, and 1.4 degrees, respectively.

Shallow inclinations are important because the beam exits the semiconductor structure nearer to the facet normal. By contrast, the exit angles for the waveguide semiconductor structures with the 2 μm, 4 μm, 6 μm, and 8 μm modes are 21 degrees, 10.5 degrees, 6.9 degrees, and 5.2 degrees respectively relative to the facet normal. One important advantage of passive waveguides compared to flaring the end of the amplification waveguide is that the narrow passive waveguide allows only the fundamental mode to propagate and does not require careful control of a geometrical shape such as a flare. In addition, the narrow passive waveguide is straightforwardly fabricated with an increased bandgap by layer disordering and so can be passive, thereby reducing the current required by the structure.

The passive waveguide 114 provides a similar function of suppressing optical reflection at the angled output facet 106 as light is transmitted from the active optical waveguide 112 through the passive waveguide 114 through the output facet 106 to the output fiber optic 108.

When operated at zero or reverse bias, the amplification waveguide is highly absorptive, thereby producing the nontransmitting or off state of the switch. The transmitting or on state is obtained by forward biasing each amplification waveguide with an appropriate current level. Each amplification waveguide has its own separately addressable contact, so that each amplification waveguide can be independently addressed to transmit light or not transmit light coupled into the waveguide. Thus, transmission of the light beam from input optical fiber 102 into the corresponding output fiber 108 can be allowed or prevented, depending on the externally programmed state of the amplification waveguide 112. The intensity of the transmitted light can be controlled by the level of the forward current applied in the on state, and the gain of each amplification waveguide can be used to compensate for losses incurred in other parts of the system. Thus, the semiconductor structure 100 will function as an optical switching array.

Adequate suppression of the reflection at the facets is obtained at reduced angles enhancing the effectiveness of the anti-reflective coatings and resulting in light emission that is nearly normal to the facet.

The narrow passive waveguide at the facet allows only the fundamental mode to propagate, whereas flared ends previously used with amplification waveguides at the facets are susceptible to propagation of non-fundamental modes.

The fabrication tolerances are easier to satisfy for the narrow passive waveguide at the facet than for a flared geometry of the amplification waveguide at the facet because no critical shaping of the transition region is required. A narrow passive waveguide can consequently be shorter than a flared amplification waveguide.

The bandgap of the narrow passive waveguide is straightforwardly increased as part of the fabrication process, thereby allowing it to be passive without introducing high loss.

Figure 6:
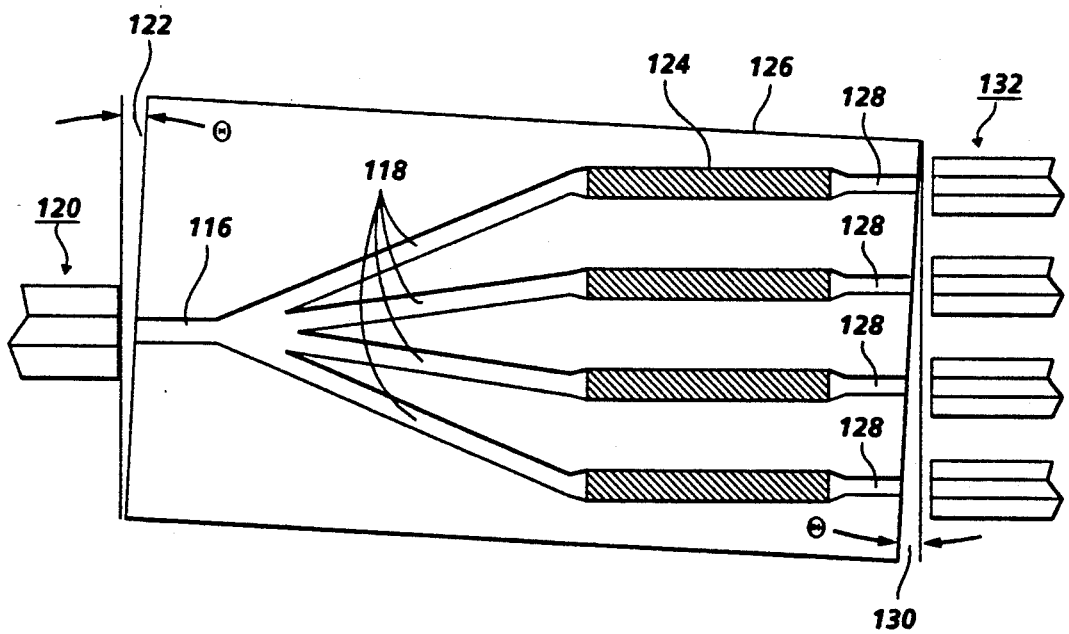
FIG. 6 is a schematic illustration of a monolithic semiconductor structure in which the angled facets and the passive optical waveguides are coupled to the amplification waveguides of an optical switching array formed according to the present invention.

When the input beam is contained in a single mode optical fiber, an optical splitter is required to provide the fanout from one channel to the individual elements in the switching array. This fanout can be integrated with the array of the semiconductor structure. FIG. 6 shows a fanout in which the single input passive waveguide 116 is split into separate guides 118 at one point 121 so that light from a single optical fiber 120 can be transmitted through an angled input facet 122 through the fanout to separate amplification waveguides 124 in the structure 126 through separate passive waveguides 128 through an angled output facet 130 to separate output optical fibers 132.

Alternately, a fanout can be made from Y-couplers or a horn arrangement in which the output waveguides are placed around a contour that matches the wavefront of the radiating beam. These arrangements with the exception of the horn can also be used in reverse as optical combiners to bring several beams back together after passing through the switching elements.

Figure 7:
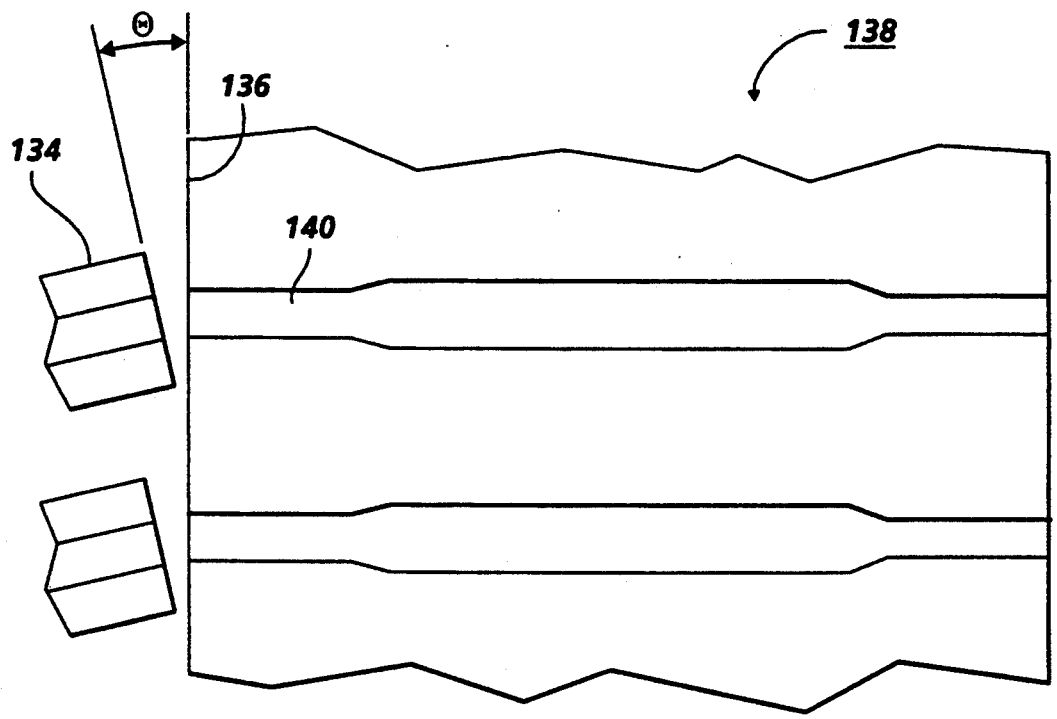
FIG. 7 is a schematic illustration of a monolithic semiconductor structure in which the angled optical fiber provides incident light waves to the facets and the passive optical waveguides are coupled to an array of amplifying waveguides formed according to the present invention.

Alternately, as shown in FIG. 7, the input optical fiber 134 can be at an angle θ relative to the input facet 136, which is normal of the semiconductor structure 138. The angle θ in FIG. 7 would be the same angle that the facets are angled in FIGS. 5 and 6. However, the incident beam will be striking the facet and more importantly, the passive waveguide 140, at an angle which will reduce the amount of propagating light making this alternate embodiment less effective than the one previously described. The output facet could also be at an angle θ relative to the normal output facet.

The space between active elements, such as the amplification waveguides, in the array in the heterostructure may be wide gap material, produced for example by the layer disordering used to form the individual waveguides. Consequently the intra-stripe regions will be transparent in the spectral region where the loss of the amplification waveguides can be electrically controlled. This transparency means that the intra-stripe space at the output of the array will emit unguided light as a background leakage. The contrast between the bright spots guided by the amplification waveguides and this unguided background can be kept adequately high by increasing the optical length of the array. Other designs in which inactive absorptive regions are located between the active elements of the array are also possible.

Although the preceding devices are primarily fabricated in GaAs/AlGaAs epitaxial layers with the techniques of impurity induced disordering as described by the Thornton et al. patent, similar devices can also be realized with other fabrication technologies such as etch and regrowth or photo-assisted epitaxial growth and in other materials such as InP/GaInAsP, AlGaInP/GaAs, etc.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A semiconductor optical array comprising:
  a monolithic semiconductor structure having a plurality of semiconductor heterostructure layers disposed over a substrate, at least one of said layers being an active layer for light amplification and propagation;
  means, electrically coupled for applying an electrical forward bias to said active layer;
  an input facet and an output facet disposed at opposing ends of said monolithic semiconductor structure, perpendicular to said plurality of semiconductor heterostructure layers and said active layer, said input facet receiving incident light waves and said output facet propagating transmitted light waves;
  a plurality of substantially parallel amplification waveguides, disposed in the active layer, with each of said amplification waveguides having a predetermined width for generating and amplifying light waves at a given wavelength in response to said electrical forward bias;
  a first plurality of substantially parallel, low-loss, passive waveguides disposed in a first part of said active layer, each passive waveguide oriented co-axially to a corresponding amplification waveguide and co-extensively coupled at one end to said input facet and at the other end to said corresponding amplification waveguide for guiding lightwaves received in said input facet;
  and a second plurality of substantially parallel, low-loss, passive waveguides disposed in a second part of said active layer, each passive waveguide oriented co-axially to a corresponding amplification waveguide and co-extensively coupled at one end to said corresponding amplification waveguide and at the other end to said output facet for guiding said amplified lightwaves generated in said corresponding coupled amplification waveguide to said output facet;
  wherein said facets are angled relative to said light waves to reduce reflection from said light waves propagating through said facet to said waveguides.

2. The semiconductor optical array of claim 1 wherein said facets are coated with an anti-reflective coating.

3. The semiconductor optical array of claim 1 wherein the width of said passive waveguides is less than the critical width required for confinement of the optical mode of said light waves propagating through said facet to said passive waveguides.

4. The semiconductor optical array of claim 1 wherein the effective mode reflectivity, R, at said facet, $$R = 0.3 \times \exp[-(nW\theta/\lambda)^2]$$

with n as the refractive index of said passive waveguide, W is the mode width of said light waves, θ is said passive waveguide's inclination from said facet normal, and λ is the wavelength of said light waves.

5. The semiconductor optical of claim 4 wherein R is less than 0.01%.

6. A semiconductor optical array comprising:
  a monolithic semiconductor structure having a plurality of semiconductor heterostructure layers disposed over a substrate, at least one of said layers being an active layer for light amplification and propagation;
  means, electrically coupled for applying an electrical forward bias to said active layer;
  an input facet and an output facet disposed at opposing ends of said monolithic semiconductor structure, perpendicular to said plurality of semiconductor heterostructure layers and said active layer, said input facet receiving incident light waves and said output facet propagating transmitted light waves;
  a plurality of substantially parallel amplification waveguides, disposed in the active layer, with each of said amplification waveguides having a predetermined width for generating and amplifying light waves at a given wavelength in response to said electrical forward bias;
  a first plurality of substantially parallel, low-loss, passive waveguides disposed in a first part of said active layer, said first plurality of said passive waveguides being less than said plurality of said amplification waveguides, each passive waveguide co-extensively coupled at one end to said input facet for guiding lightwaves received in said input facet;
  a plurality of optical splitters disposed in said active layer, each optical splitter oriented co-axially to a corresponding passive waveguide in said first plurality and oriented co-axially to at least two corresponding amplification waveguides and co-extensively coupled at one end to said passive waveguide in said first plurality and at the other end to said at least two corresponding amplification waveguides for guiding lightwaves propagated in said passive waveguide in said first plurality;

and a second plurality of substantially parallel, low-loss, passive waveguides disposed in a second part of said active layer of said second part, each passive waveguide oriented co-axially to a corresponding amplification waveguide and co-extensively coupled at one end to said corresponding amplification waveguide and at the other end to said output facet for guiding said amplified lightwaves generated in said corresponding coupled amplification waveguide to said output facet;

wherein said facets are angled relative to said light waves to reduce reflection from said light waves propagating through said facet to said waveguides.

7. The semiconductor optical array of claim 6 wherein said facets are coated with an anti-reflective coating.